(12) United States Patent
Johnson

(10) Patent No.: US 6,229,319 B1
(45) Date of Patent: May 8, 2001

(54) CHIP CARRIER TO ALLOW ELECTRON BEAM PROBING AND FIB MODIFICATIONS

(75) Inventor: Douglas S. Johnson, Palo Alto, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/191,278

(22) Filed: Nov. 12, 1998

Related U.S. Application Data

(62) Division of application No. 08/620,274, filed on Mar. 22, 1996, now Pat. No. 5,838,159.

(51) Int. Cl.[7] .................................................. G01R 31/308
(52) U.S. Cl. ............................ 324/751; 324/750; 324/755
(58) Field of Search .................................... 324/750, 751, 324/752, 754, 765, 755

(56) References Cited

U.S. PATENT DOCUMENTS

| | | | |
|---|---|---|---|
| 3,596,228 | * | 7/1971 | Reed, Jr. et al. ..................... 439/513 |
| 4,532,423 | * | 7/1985 | Tojo et al. ............................ 324/751 |
| 4,772,846 | * | 9/1988 | Reeds ................................... 324/751 |
| 4,855,673 | * | 8/1989 | Todokoro ............................. 324/754 |
| 4,881,029 | * | 11/1989 | Kawamura ........................... 324/751 |
| 4,963,821 | * | 10/1990 | Janko et al. .......................... 324/754 |
| 5,087,877 | * | 2/1992 | Frentz et al. ......................... 324/760 |
| 5,519,658 | | 5/1996 | Uda et al. ............................. 324/755 |
| 5,541,525 | | 7/1996 | Wood et al. .......................... 324/755 |
| 5,583,445 | * | 12/1996 | Mullen ................................. 324/754 |

OTHER PUBLICATIONS

Estes, Richard and Kulesza, Frank, "Environmental and Reliability Testing of Conductive Polymer Flip Chip," American Superconductor Corporation, (Month Unavailable) 1993.

Prokopchak, Lina, AEHR Test Systems KGD Product Manager and Wrenn, James, AEHR Test Systems Chief KGK Scientist, "Development of a Burn–in and Test Process for Producing Known–Good–Die," KGD—P/N 405–56001–00, (Prior to Aug. 1995).

Prokopchak, Lina, AEHR Test Systems, Presented at ITC, Washington D.C., "Development of a Solution for Achieving Known–Good–Die," Sep. 1994.

Product Brochure, DiePak™ Known Good Die Solutions, (Prior to Aug. 1995).

Kulesza, Frank W. and Estes, Richard H., Solderless Flip Chip Technology, Hybrid Circuit Technology, Feb. 1992.

Product Brochure, Epoxy Technology, Inc., (Prior to Aug. 1995).

Kulesza, Frank W., Estes, Richard H., and Spanjer, Keith, "A Screen–Printable Polyimide Coating for Silicon Wafers", Jan. 1988 edition of Solid State Technology.

Product Brochure, PFC™, Epoxy Technology, Inc., Chip Interconnect Comparison (Prior to Aug. 1995).

Estes, Richard H., "Fabrication and Assembly Processes for Solderless Flip Chip Assemblies", ETI, Jun. 1993.

Procuct Brochure, QC²™ Quest Chip Carrier, Fresh Quest Corporation, (Prior to Aug. 1995).

\* cited by examiner

*Primary Examiner*—Ernest Karlsen
(74) *Attorney, Agent, or Firm*—Beyer Weaver & Thomas LLP

(57) ABSTRACT

Disclosed are a die carrier and associated method for conducting probe beam tests on chips designed to be packaged in flip-chip packages. The die carrier is a specially modified membrane type carrier that includes a probe access region, such as an opening, in the membrane. A die to be tested is mounted in the die carrier such that its I/O pads make electrical contact with corresponding bump contacts on the membrane. The die/carrier assembly is then mounted in a test socket provided on a chip testing apparatus such that electrical I/O signals can be provided to and from an external test circuit. While the die is being electrical tested, a probe beam is directed through the probe access region and onto the chip active surface. In this manner, the chip active surface is probed while exposed to electrical stimulus.

20 Claims, 5 Drawing Sheets

CHIP CARRIER TO ALLOW ELECTRON BEAM PROBING AND FIB MODIFICATIONS

This is a divisional of U.S. patent application Ser. No. 08/620,274, filed on Mar. 22, 1996, now U.S. Pat. No. 5,838,159.

BACKGROUND OF THE INVENTION

The present invention pertains to testing apparatus for integrated circuits designed to be packaged as "flip-chips or other die." More particularly, the present invention pertains to testing apparatus having a probe access region for allowing electron beams or other probe forms to access the active areas of integrated circuits.

When a complex integrated circuit such as a microprocessor is being designed, and before it is put into commercial use, it is critical to verify its design. This design verification process identifies flaws in the circuit design and often leads to performance improvements. Early in the design phase, the integrated circuit exists only as a software representation and all design verification is accomplished with software tools. Later, actual silicon integrated circuits are fabricated and subjected to direct testing. There are various methods for conducting such tests, and these will now be described.

Electron beam probing, commonly referred to as "e-beam" probing, is one such method used to identify design flaws in test dies. Die testing begins by electrically connecting the die's input/output ("I/O") pads to a tester which can provide electrical signals to some or all input pads on the die. After the die is so connected, an electron beam probes the active area of the die. The impact of the high energy electrons of the electron beam results in the emission of secondary electrons which may be detected and converted to a video image of the die active surface by standard techniques. This image is essentially a scanning electron micrograph ("SEM") of the die surface and often reveals flaws on the die surface. In addition, electron beam probing allows detectors to monitor variations in the potential energy of the secondary electrons which is proportional to the device's surface potential. As such variations can result from propagation of electronic signals through a circuit element being probed with an electron beam, the probe can determine whether a given circuit element is responding to I/O stimulus in the expected manner.

Another common debugging technique is the use of a focused ion beam ("FIB") for imaging and modification of devices. This technique employs an ion beam of a heavy element such as gallium. The ion beam is targeted on the die surface, where the impact of the heavy gallium ions causes some material removal. The simultaneous emission of secondary ions from the die surface produces an SEM-like image. Thus, FIB imaging can be used to identify manufacturing flaws in a manner analogous to electron beam probing. In addition, because the gallium ions are heavy enough to remove atoms (as opposed to merely removing electrons), FIB probing may be employed to modify the surface structure of a test die. In fact, FIB technology may be employed to perform "microsurgery" on test dies by, for example, changing a metallization pattern at some level on the test die. This allows various design modifications to be made and tested quickly without the need for generating a whole new test die each time a simple change is to be tested.

Not surprisingly, electron beam and FIB probing have become essential to the integrated circuit design procedure. The increasing popular "flip-chip" package design, however, has rendered these types of beam probing nearly impossible. The flip-chip package employs solder bumps at I/O pads on the die active surface. Thus, to make electrical contact to external circuitry, the die simply is mounted "face down" on a substrate. This feature is represented in FIGS. 1A and 1B. As shown in FIG. 1A, a flip-chip package design includes solder bumps 11 (referred to as "bump pads" herein) placed on the active surface of a die 10. In order to mount (and thereby electrically connect) the flip-chip die, as shown in FIG. 1B, the die 10 is "flipped" up-side-down onto a substrate 13 containing contacts to the solder bumps. Thereafter, the solder bumps 11 are heated until they flow and form contacts 11' as shown. Further, the die is glued onto substrate 13 by applying an epoxy material 12 to hold the die in electrical contact with the substrate. Unlike to the conventional packaging design, the active region of the die is now blocked by a packaging substrate and therefore inaccessible to a probing beam. Thus, there is a need for a new testing tool or method to perform probe beam verification of integrated circuit designs to be employed in flip-chip packages.

SUMMARY OF THE INVENTION

The present invention provides a die carrier and associated method for conducting probe beam tests on chips designed to be packaged in flip-chip packages. The die carrier is a specially modified membrane-type carrier that includes a probe access region (typically an opening) in the membrane. A die to be tested is mounted in the die carrier such that its I/O pads make electrical contact with corresponding bump contacts on the membrane. The die/carrier assembly is then mounted in a test socket provided on a chip testing apparatus such that electrical I/O signals can be provided to and from an external test circuit. While the die is being electrically tested, a probe beam is directed through the probe access region and onto the chip active surface. In this manner, the chip active surface is probed while exposed to electrical stimulus.

One aspect of the invention provides a membrane-type die carrier which allows probing of an active region of a die designed for use in a flip-chip package. Specifically, this aspect of the invention is intended to be used with a die that includes "peripheral input/output bump pads" located about the periphery of its active region. The die carrier may be characterized as including the following features: (1) a membrane designed to allow access to a probe such as an electron beam, and (2) a membrane carrier supporting the membrane and having an opening corresponding, at least in part, to a location of a probe access region on the membrane. The membrane itself may be characterized as including (a) the probe access region which makes substantially all of the die's active region accessible to a probe, (b) a plurality of peripheral bump contacts adjacent to the probe access region and arranged to make electrical contact with the peripheral bump pads of the die, and (c) a plurality of socket contacts electrically connected to said peripheral bump contacts. The socket contacts make electrical contact with corresponding contacts in a test socket when the carrier is inserted in such socket.

The membrane may comprise any suitable resilient material, with polyimide being one preferred material. Typically, the bump contacts and the socket contacts are electrically connected by traces formed on the membrane surface. In order to maintain adequate separation between traces on some die carriers, the membrane may include multiple layers of insulator, each having traces formed thereon. The membrane carrier preferably has a rigid structure, which is adapted to connect with a test socket of a test apparatus. One suitable material for making the carrier is anodized aluminum. A closing member is preferably employed to engage the rigid membrane carrier such that when the closing member is closed, the peripheral bump pads on the die are held in electrical contact with the peripheral bump contacts of the membrane.

One reason that flip-chip packaging has become popular is because the I/O bump pads can be placed at any location on the surface, not simply the chip periphery. Thus, some flip-chips contain one or more "area" bump pads located inside the periphery of the die on the active surface. In order to electrically access such area bump pads, the die carriers of this invention may include an area bump contact section on the membrane and spanning the probe access region. The area bump contact section includes one or more peripheral bump contacts arranged to line up with the area bump pads on the die. In an alternative embodiment, the area bump pads are contacted by an external mechanical probe typically provided as part of the test socket or other test apparatus, and not as part of the die carrier.

In another aspect, the present invention provides a method for probing a die designed for use in a flip-chip package and having an active region that includes one or more peripheral bump pads located on the periphery of the active region of the die. The method may be characterized as including the following steps: (1) supporting the die in a die carrier such that the peripheral bump pads are electrically connected to an external test circuit; and (2) accessing the active region with a probe beam directed onto the active region of the die through a probe access region. The die carrier preferably has a structure as described above. Thus, an electron beam or focused ion beam may access the active region of the die through the probe access region. In many cases, the method will include a preliminary step of mounting the die carrier in a test socket of a test apparatus.

If the active region of the die includes one or more area bump pads located interior to the periphery of the die, the method may be further characterized by a step of electrically contacting one or more of the area bump pads with an external mechanical probe from test apparatus external to the die carrier.

These and other features and advantages of the present invention will become apparent to those skilled in the art upon reading the following description and studying the associated figures.

DESCRIPTION OF THE PREFERRED EMBODIMENTS

Figure 1A:
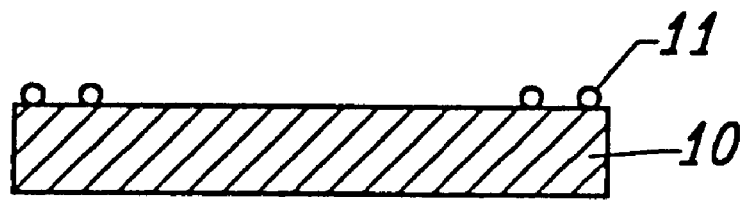
FIG. 1A is a side sectional view of a conventional die of the type used in a flip-chip package design.
Figure 1B:
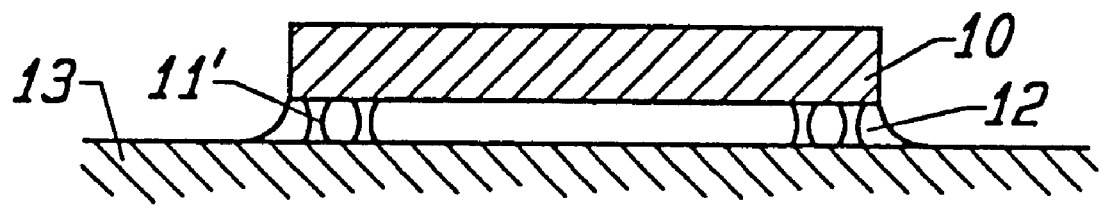
FIG. 1B is a side sectional view of the flip-chip die of FIG. 1A mounted on a substrate so as to make an electrical contact with the substrate.
Figure 2A:
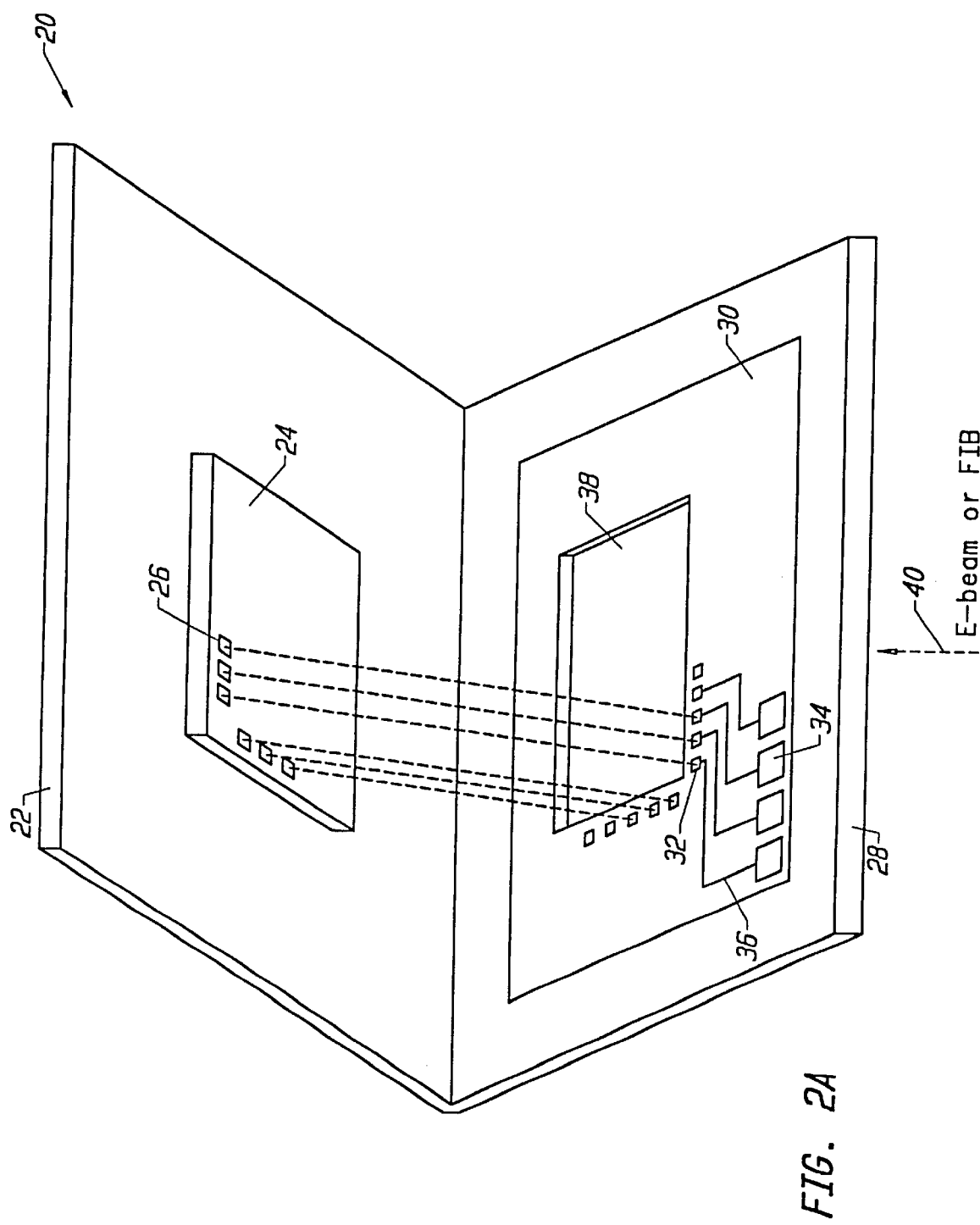
FIG. 2A is a perspective view of the flip-chip test die carrier assembly in accordance with the present invention.
Figure 2B:
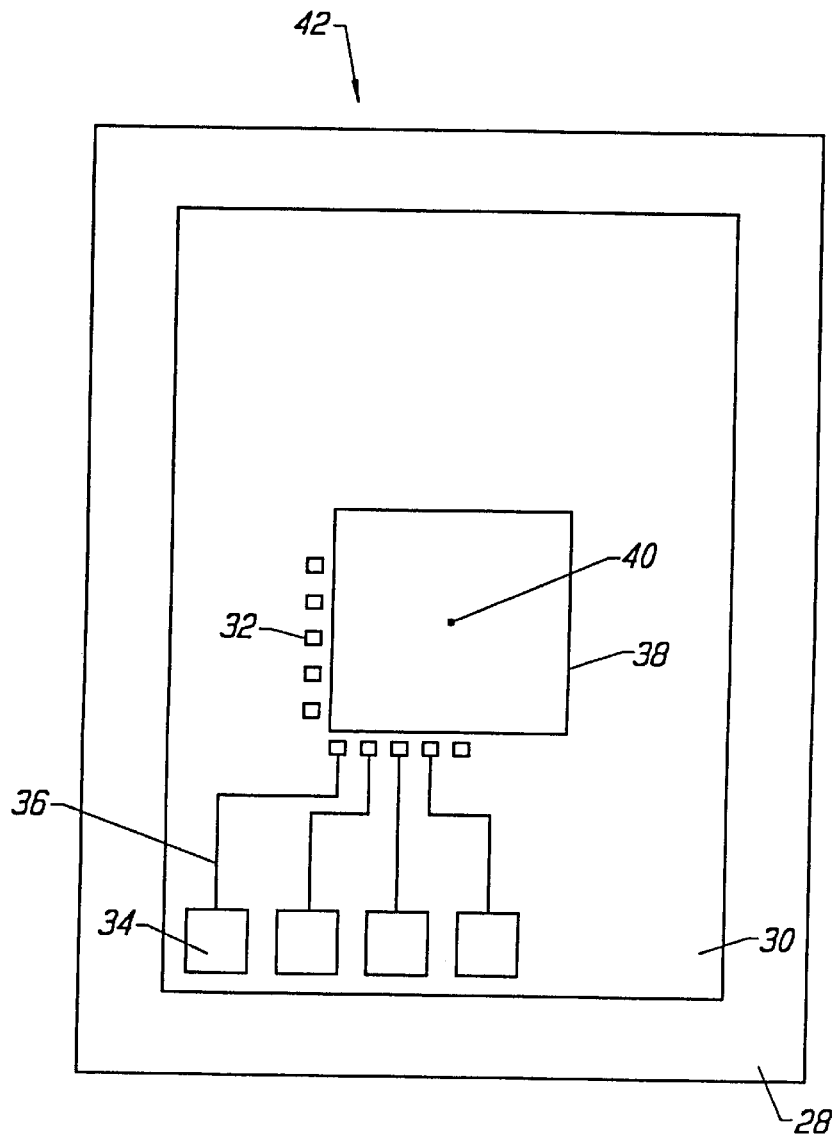
FIG. 2B is a top view of a lower portion of the test die carrier assembly shown in FIG. 2A.
Figure 2C:
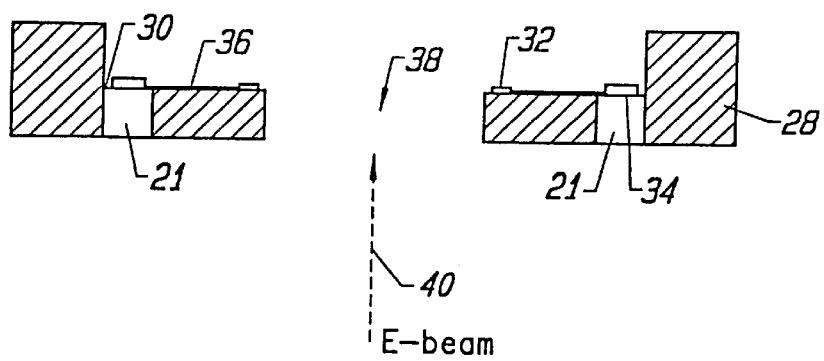
FIG. 2C is a side sectional view of the lower portion of the test die carrier assembly shown in FIG. 2A.

Turning first to FIGS. 2A, 2B, and 2C, a flip-chip test die carrier assembly 20 in accordance with a preferred embodiment of this invention is shown. FIG. 2A is a perspective view of the entire die carrier assembly 20, while FIG. 2B is a top view and FIG. 2C is a side view further illustrating a lower portion 42 (28) of the die carrier 20. A top portion of die carrier 20 includes a closing member 22 that engages the lower portion 42 in order to lock a die 24 within the die carrier. While the connection between the closing member 22 and the. lower portion are shown to be connected by a hinge, this need not be the case. For example, these portions may be provided as separate elements to be connected by screws, clamps, or functionally similar mechanical devices, likely using guide pins to assure alignment.

The die 24 has an electrically active region including peripheral bump pads 26 (i.e., the die is a flip-chip as described above). The lower portion of the test die carrier assembly 20 includes a rigid membrane carrier 28 supporting a more flexible membrane 30. The membrane 30 includes a probe access region 38, peripheral bump contacts 32, and socket contacts 34. The peripheral bump contacts 32 are arranged on the membrane 30 to perfectly align with the peripheral bump pads 26 of the die 24. Thus, when the closing member 22 closes onto the lower portion of carrier assembly 20, the I/O bump pads of the die are placed in electrical communication with the contacts 32. Traces 36 electrically connect the peripheral bump contacts 32 to the socket contacts 34. The membrane carrier 28 has an opening corresponding to the location of the probe access region 38, which allows a probe beam 40 (e.g., an electron or focused-ion beam) to probe the active region of the die 24.

Before electron beam probing is conducted, die testing requires that the bump pads 26 on the die 24 be electrically connected to an external test circuit so that electrical test signals may be provided to some or all input pads on the die. Typically, such external test circuit communicates with the test chip via a "socket" on a printed circuit board—which forms part of the tester apparatus. Thus, the membrane carrier 28 is adapted such that socket contacts 34 can connect with corresponding leads of a test socket (not shown) of a test apparatus (not shown). When electrical test signals are provided from the test apparatus, they pass from the test socket to the socket contacts 34 on membrane 30, through traces 36, to bump contacts 32, and ultimately into the flip chip 24 through bump pads 26. In one embodiment, socket contacts 34 are provided on the bottom of membrane 30 (i.e., the side opposite bump contacts 32). The lines 36 may be on the top or bottom of membrane 30. If they are on top, then a vertical interconnect in socket contacts 34 will be necessary. Alternatively, if they are on the bottom, a vertical interconnect to bump contacts 32 will be necessary. Alternatively, the socket contacts 34 may be provided in a membrane slot 21 as shown in FIG. 2C.

Generally, the electron beam or focused ion beam probing process begins by engaging the top and lower portions of the test die carrier assembly as discussed. Next, the carrier assembly is mounted in a test socket to provide electrical communication with the external test apparatus which, in turn, supplies power and electrical input signals as appropriate for the test at hand. This apparatus is attached to vacuum chamber, and then an electron or ion beam probes the active region of the die through the probe access region. A more detailed discussion of this general process is set forth below.

The membrane 30 can be any insulating resilient material, with polyimide being one suitable material. A membrane according to the present invention may comprise one or more layers of insulating material, each of which includes one or more traces 36 connecting the peripheral bump contacts 32 to the socket contacts 34. It may be necessary to provide the membrane in multiple layers in order to allow adequate separation distance between traces of adjacent bump contacts. In some embodiments, power and ground planes may be provided within the membrane layers for better power dissipation and impedance control of signal traces.

The probe access region 38 is a region on membrane 30 that allows appropriate probe beam radiation to penetrate to the die active surface. Region 38 must be sized and shaped such that most or all of the die active surface is accessible to a probe. Further, in some cases, it will be necessary to provide an opening in the membrane 30 of sufficient size to allow access by an external mechanical probe, described in more detail below.

Peripheral bump contacts 32 are positioned adjacent to the probe access region 38 by forming conductive regions (e.g., layers of copper foil that are chemically etched) on the membrane 30. Similarly, socket contacts 34 are formed from relatively larger conductive regions on the membrane 30. Traces 36 connecting the peripheral bump contacts to the socket contacts are similarly formed. The bump contacts 32, traces 36, and socket contacts 34 are preferably each provided as flat conductive regions on the insulating surface of membrane 30. Such conductive regions may be formed in one step by any of many conventional metal on substrate formation/patterning processes.

The membrane carrier 28 supports and anchors the membrane 30, and therefore a membrane carrier assembly with a rigid structure is preferred. This rigid structure must have an opening sized and shaped to allow probe beams to access most or all of the die active surface through the probe access region 38 on membrane 30. Thus, the membrane carrier opening typically will correspond in size and shape to the probe access region of the membrane. However, this need not always be the case. For example, the opening may be somewhat wider than the probe access region 38, so long as the membrane carrier 28 adequately supports membrane 30. Generally, any rigid material may be used to construct the membrane carrier. In one specific embodiment, the carrier is constructed of anodized aluminum. As noted, the membrane carrier 28 should be adapted to connect with a test socket of a test apparatus. Thus, the outer surface of membrane carrier 28 may be supplied with grooves, ridges, or other contours or mechanisms to conveniently engage corresponding contours/mechanisms on the socket, as well as provide openings for making contact to socket pads 34.

Figure 3A:
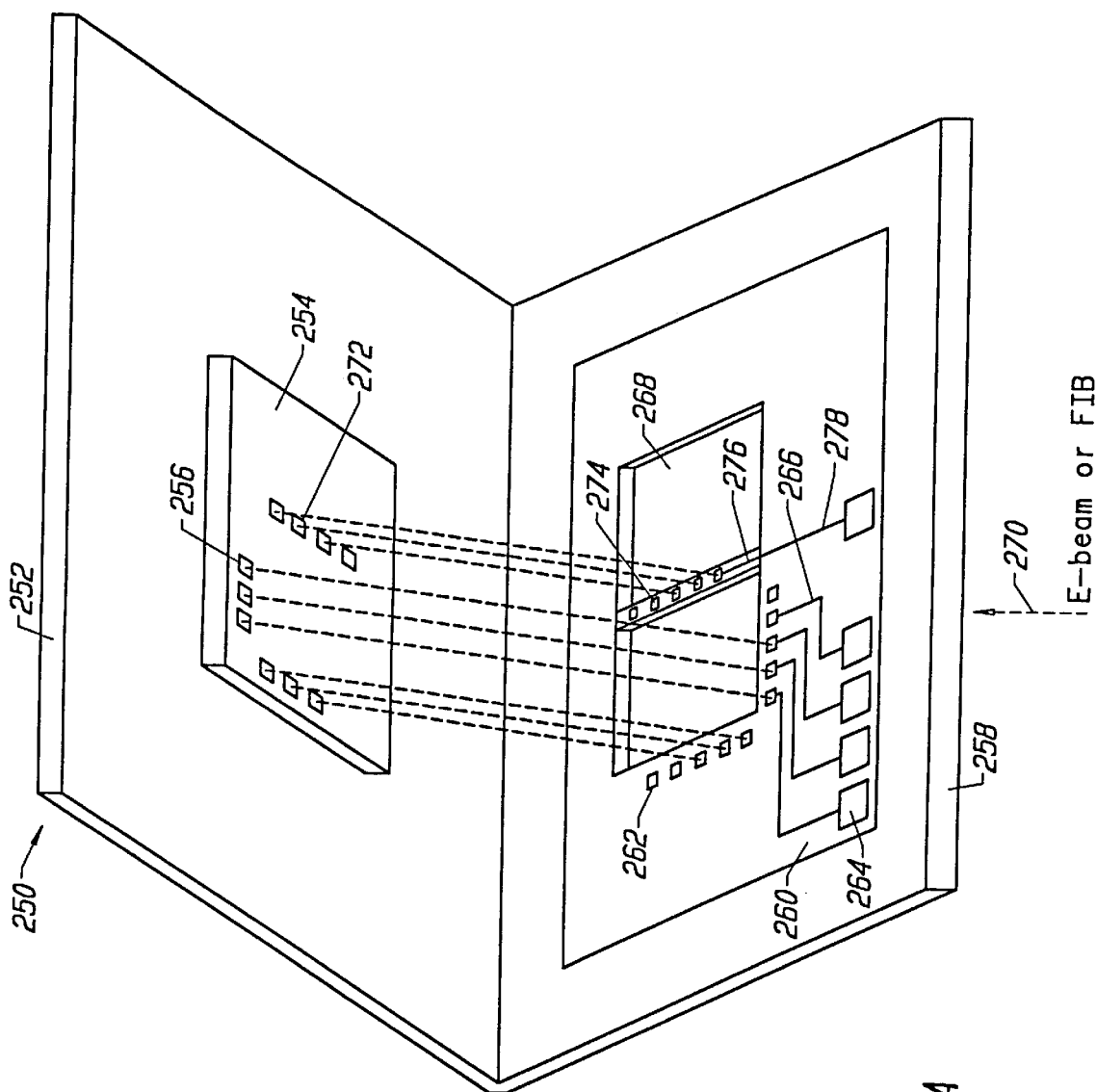
FIG. 3A is a perspective diagram of an alternate test die carrier assembly which includes an additional section for making contact with area bump contacts located within the die periphery.
Figure 3B:
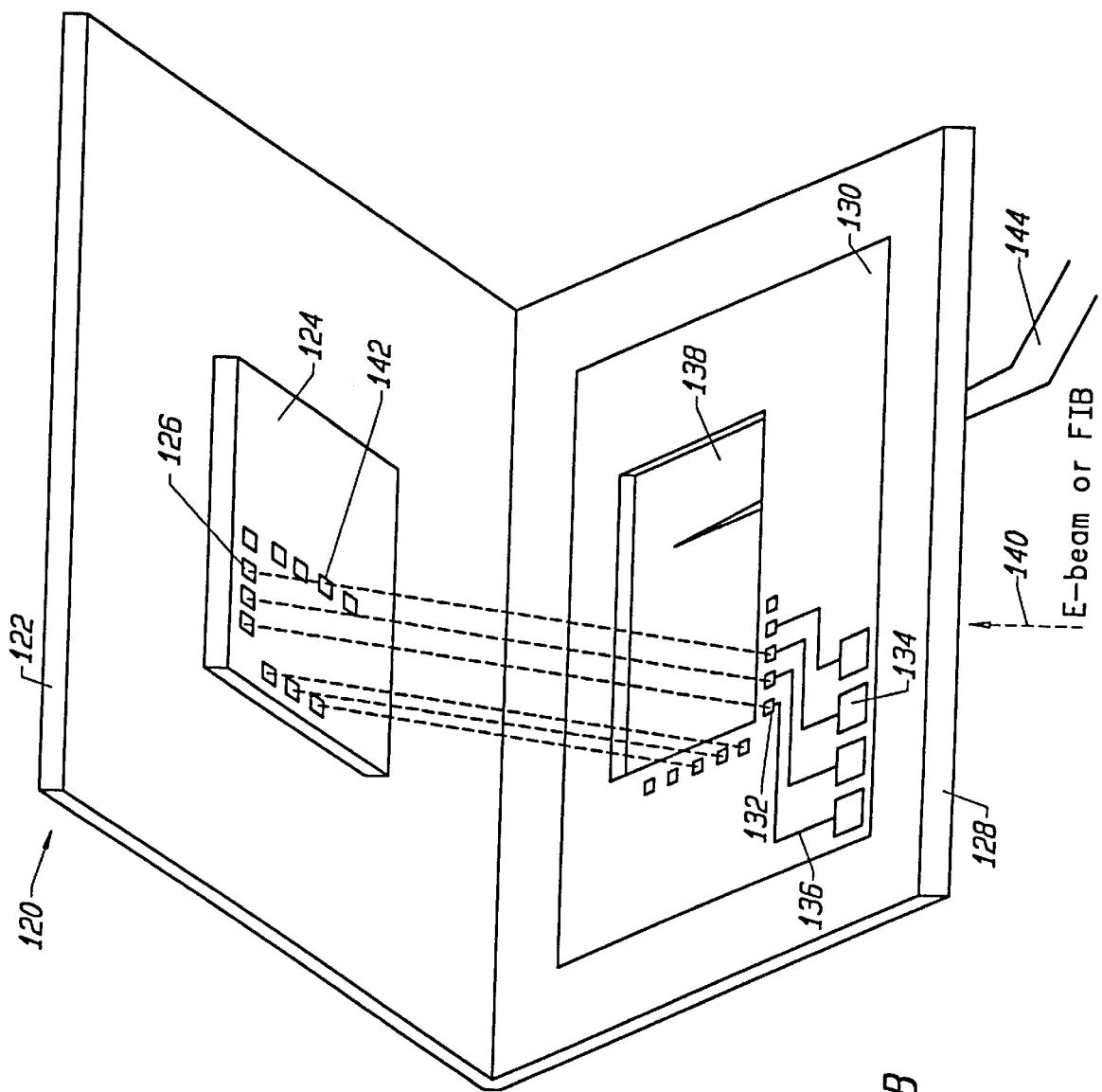
FIG. 3B is a perspective diagram of the test die carrier assembly of FIG. 2A shown with an external mechanical probe for contacting area bump contacts on the die surface.

In the embodiment described above with respect to FIGS. 2A—2C, the flip-chip die included peripheral bump pads only. That is, the bump pads are provided along the die perimeter, but not elsewhere on the die surface. In some cases, flip-chips will include bump pads at locations interior to the chip perimeter. As noted, such interior bump pads are referred to herein as "area bump pads". Some modification to the test die carrier assembly illustrated in FIGS. 2A–2C may be necessary to provide electrical contact with area bump pads. FIGS. 3A and 3B illustrate two embodiments of the present invention that are intended to address the particular problems associated with probing dies having area bump pads.

Turning first to FIG. 3A, a perspective diagram of an alternative embodiment of a test die carrier assembly of this invention is provided. As shown, a test die carrier assembly 250 includes an additional section 276 for making contact with area bump pads inside the die periphery. Like the embodiment described with reference to FIGS. 2A–2C, the test die carrier assembly 250 has a closing member 252 that supports a die 254. The die 254 has an electrically active region including peripheral bump pads 256 and area bump pads 272 located inside the die periphery. A lower portion of the test die carrier assembly 250 includes a membrane carrier 258 supporting a membrane 260. The membrane 260 includes a probe access region 268, area bump contact section 276, peripheral bump contacts 262, area bump contacts 274, traces 266, and socket contacts 264. As in the first described embodiment, the peripheral bump contacts 262 are arranged on the membrane 260 to perfectly align with the peripheral bump pads 256 of the die 254. In addition, the area bump contacts 274 are arranged on the area bump contact section 276 to perfectly align with the area bump pads 272 of the die 254. A trace 278 electrically connects at least one of the area bump contacts 274 to at least one of the socket contacts 264. Note that a membrane carrier 258 has an opening corresponding to the location of the probe access region 268, which allows a probe beam 270 to access the active region of the die 254. While the probe beam will not be able to access the die surface under area bump contact section 276, this generally will not limit the useful probe access, as that die surface region should have only I/O structures or power distribution networks.

Turning now to FIG. 3B, a perspective diagram of a test die carrier assembly 120 as shown in FIG. 2A is provided. In the embodiment of FIG. 3B, the carrier assembly 120 is provided with one or more external mechanical probes for contacting area bump contacts on the die surface. A top portion of assembly 120 includes a closing member 122 that supports a die 124 having peripheral bump pads 126 and area bump pads 142 located inside the die periphery. The lower portion of the test die carrier assembly 120 comprises a membrane carrier 128 supporting a membrane 130. The membrane 130 includes a probe access region 138, peripheral bump contacts 132, and socket contacts 134. The peripheral bump contacts 132 are arranged on the membrane 130 to perfectly align with the peripheral bump pads 126 of the die 124. Traces 136 electrically connect the peripheral bump contacts 132 to the socket contacts 134. The membrane carrier 128 has an opening corresponding to the location of the probe access region 138, which allows an electron beam 140 to probe the active region of the die 124 and allows an external mechanical probe 144 to access the area bump pads 142 on the die 124.

Before beam probing begins, an electrical contact between the peripheral bump pads 126 and the peripheral bump contacts 132 is established when the closing member 122 engages the rigid membrane carrier 128. The membrane carrier 128 is further connected to an external test circuit, as described above, which supplies electric signals to the peripheral bump pads 126 during operation. For area bump pads 142, however, an external mechanical probe 144 accessing the membrane 130 through the probe access region 138, supplies electrical contact for necessary power or signals required for testing. Probe 144 may be provided as part of the external testing system or it may actually be provided as a part of the die carrier 120. Preferably the mechanical probe 144 is movable, as by a control system, so that it can contact various bump contacts at various angles. This provides flexibility in probing multiple chip designs and avoiding the probe beam. Certain chip I/O layouts will dictate that two or more external probe beams be provided.

A method for probing a die designed for use in a flip-chip package assembly begins by first supporting the test die in a flip-chip package assembly such that the I/O pads of the die are electrically connected to corresponding contacts on the test apparatus and the die active surface to be probed faces the probe access region. Next, the die carrier assembly is placed in a test socket while the external test circuit supplies power and electrical test signals to the die. Then the entire assembly is placed into the vacuum chamber where an electron beam probes the active region of the die through the probe access region. Note that the test apparatus must provide vacuum tight electrical feedthroughs.

The impact of the high energy electrons (or other particles) from a probe beam results in the emission of secondary electrons which may be detected and converted to a video image of the die active surface by standard techniques. As noted, this image is essentially a scanning electron micrograph of the die surface and reveals the flaws on the die surface. Electron beam probing also allows the test apparatus to monitor variation with time of the potential energy of the secondary electrons which are proportional to the device surface potential. Such variations can be used to detect electronic waveforms at various circuit elements and confirm proper functioning of such circuit elements. Thus, an external test circuit can determine if a particular circuit element in the die is responding appropriately to stimulus at selected input pads. If a focused ion beam is employed, the system allows quick modification of circuit connections to test new designs.

Although a few specific embodiments of the present invention have been described in detail, it should be understood that the present invention may be embodied in many other specific forms without departing from the spirit or scope of the invention as recited in the claims. For example, while the preferred embodiments have focused on flip chips, there is in principle no reason why the invention could not be applied to other die types.

What is claimed is:

1. A die carrier for allowing probing of an active region of a die including peripheral input/output bump pads located about the periphery of the active region, the die carrier comprising:
   a membrane having
      a probe access region for making substantially all of the die's active region accessible to a probe,
      a plurality of peripheral bump contacts adjacent to the probe access region and arranged to make electrical contact with the peripheral bump pads of the die, and
      a plurality of socket contacts electrically connected to said peripheral bump contacts; and
   a membrane carrier supporting said membrane and having an opening corresponding, at least in part, to the location of said probe access region of the membrane, wherein the die carrier, including the opening in the membrane carrier together with the probe access region of the membrane, allows probe beam radiation to directly probe the die's active region.

2. The die carrier of claim 1 wherein the membrane carrier has a structure adapted to connect with a test socket of a test apparatus such that the socket contacts make electrical contact with corresponding contacts on the test socket.

3. The die carrier of claim 1 wherein the membrane carrier comprises anodized aluminum.

4. The die carrier of claim 1 further comprising a closing member adapted to engage the rigid membrane carrier such that at least some of the peripheral bump pads on said die are held in electrical contact with said peripheral bump contacts of the membrane.

5. The die carrier of claim 1 wherein the membrane comprises polyimide.

6. The die carrier of claim 1 wherein the membrane includes multiple layers of insulator separating traces connecting the peripheral bump contacts to the socket contacts.

7. The die carrier of claim 1 further comprising an area bump contact section spanning said probe access region and including one or more area bump contacts arranged to line up with one or more area bump pads on the die, wherein the one or more area bump pads are located inside the periphery of said die active region.

8. The die carrier of claim 7 wherein the area bump contacts supply power, ground, or both power and ground to the area bump pads on the die.

9. The die carrier of claim 1 wherein the active region of said die has one or more area bump pads located inside the periphery of said die, and further comprising an external mechanical probe to provide electrical contact to one or more of said area bump pads.

10. The die carrier of claim 1 wherein the die is designed for use in a flip-chip package.

11. A die carrier for allowing probing of an active region of a flip-chip die including peripheral input/output bump pads located about the periphery of the active region, the die carrier comprising:
    a membrane having
       a probe access region for making substantially all of the flip-chip die's active region accessible to a probe,
       a plurality of peripheral bump contacts adjacent to the probe access region and arranged to make electrical contact with the peripheral bump pads of the flip-chip die, and
       a plurality of socket contacts electrically connected to said peripheral bump contacts; and
    a membrane carrier supporting said membrane and having an opening corresponding, at least in part, to the location of said probe access region of the membrane, wherein the die carrier, including the opening in the membrane carrier together with the probe access region of the membrane, allows probe beam radiation to directly probe the die's active region.

12. The die carrier of claim 11 wherein the membrane carrier has a structure adapted to connect with a test socket of a test apparatus such that the socket contacts make electrical contact with corresponding contacts on the test socket.

13. The die carrier of claim 11 wherein the membrane carrier comprises anodized aluminum.

14. The die carrier of claim 11 further comprising a closing member adapted to engage the rigid membrane carrier such that at least some of the peripheral bump pads on said flip-chip die are held in electrical contact with said peripheral bump contacts of the membrane.

15. The die carrier of claim 11 wherein the membrane comprises polyimide.

16. The die carrier of claim 11 wherein the membrane includes multiple layers of insulator separating traces connecting the peripheral bump contacts to the socket contacts.

17. The die carrier of claim 11 further comprising an area bump contact section spanning said probe access region and including one or more area bump contacts arranged to line up with one or more area bump pads on the flip-chip die, wherein the one or more area bump pads are located inside the periphery of said flip-chip die active region.

18. The die carrier of claim 17 wherein the area bump contacts supply power, ground, or both power and ground to the area bump pads on the flip-chip die.

19. The die carrier of claim 11 wherein the active region of said flip-chip die has one or more area bump pads located inside the periphery of said flip-chip die, and further comprising an external mechanical probe to provide electrical contact to one or more of said area bump pads.

20. The die carrier of claim 11 wherein the probe access region may comprise an opening in the membrane.

* * * * *